United States Patent
Norskov et al.

(10) Patent No.: US 6,646,841 B2
(45) Date of Patent: Nov. 11, 2003

(54) ESD-PROTECTION OF INTEGRATED CIRCUIT

(75) Inventors: Soren Norskov, Copenhagen (DK); Carsten Rasmussen, Copenhagen (DK)

(73) Assignee: Nokia Mobile Phones Limited, Espoo (FI)

(*) Notice: Subject to any disclaimer, the term of this patent is extended or adjusted under 35 U.S.C. 154(b) by 233 days.

(21) Appl. No.: 09/739,231

(22) Filed: Dec. 19, 2000

(65) Prior Publication Data

US 2001/0004308 A1 Jun. 21, 2001

(30) Foreign Application Priority Data

Dec. 21, 1999 (GB) ............................................. 9930243

(51) Int. Cl.[7] .............................................. H02H 9/00
(52) U.S. Cl. ........................................ 361/56; 361/111
(58) Field of Search ........................... 361/56, 111, 117, 361/118, 119, 127, 91.1

(56) References Cited

U.S. PATENT DOCUMENTS

| 5,500,546 A | * | 3/1996 | Marum et al. ............... 257/358 |
| 5,535,084 A | | 7/1996 | Nakayama |
| 5,598,313 A | | 1/1997 | Gersbach |
| 5,748,425 A | | 5/1998 | Gutsch et al. |
| 5,751,051 A | | 5/1998 | Hayano |
| 5,751,507 A | | 5/1998 | Watt et al. |
| 5,875,086 A | * | 2/1999 | Narita ........................ 361/111 |
| 5,889,644 A | | 3/1999 | Schoenfeld et al. |
| 6,377,315 B1 | * | 4/2002 | Carr et al. .................. 348/725 |
| 6,445,039 B1 | * | 9/2002 | Woo et al. ................... 257/355 |

FOREIGN PATENT DOCUMENTS

| EP | 0 533 640 A1 | 3/1993 |
| JP | 07106522 | 4/1995 |
| JP | 09282044 | 10/1997 |
| JP | 10290519 | 10/1998 |
| JP | 11154733 | 6/1999 |
| WO | WO9216019 | 9/1992 |

* cited by examiner

Primary Examiner—Stephen W. Jackson
Assistant Examiner—James Demakis
(74) Attorney, Agent, or Firm—Antonelli, Terry, Stout & Kraus, LLP

(57) ABSTRACT

A chip assembly comprising a chip mounted on a support is disclosed. The chip assembly comprises at least one terminal and discharge means for discharging a charge accumulated on or transferred to the at least one terminal. The discharge means is connected to an RF common mode node for at least one circuit on the chip.

31 Claims, 1 Drawing Sheet

ESD-PROTECTION OF INTEGRATED CIRCUIT

BACKGROUND OF THE INVENTION

1. Field of the Invention

The present invention relates to electrostatic discharge protection in integrated circuits, in particular the invention relates to discharge protection in a chip assembly comprising a chip mounted on a support, the chip assembly comprising at least one terminal and discharge means for discharging a charge accumulated on or transferred to the terminal.

2. Description of the Prior Art

In modern chip-making the dimensions of the chip parts have been ever decreasing. Further these components exhibit high impedances. This has led to problems, because with decreased dimensions and increased impedances, the chips become more vulnerable to electrostatic discharges.

The high impedance of the chip allows potentially harmful electrostatic charges to accumulate on the external terminals or to be transferred thereto during manufacture, handling, storing, transport or mounting etc. of the chip.

These charges may be so large that they cause breakdown in the isolating layers of the active parts, e.g. transistors, resulting in a damaging discharge of the accumulated charge through the insulating layers of the active parts.

Even though the individual active part is damaged or even destroyed, this may not always be immediately apparent from the exterior of the chip, but may show only months later. In fact, sometimes the circuit will work, but with decreased performance.

It is well known in the art to overcome these problems by introducing protection means in the chip. A typical way is to introduce a zener diode between the terminal and ground and/or a diode between the terminal and the supply voltage.

However, the use of additional components such as zener and other diodes has the drawback that they load the terminal. In low frequency applications this is normally not a problem, but in RF circuits even the capacitance of a diode may load the circuit sufficiently to have significant influence on its performance. In particular this is the case in RF oscillator circuits, where the oscillation frequency is a function of capacitances and inductances associated with the circuit or incorporated therein.

In many semiconductor devices the active circuits are embodied as balanced circuits. There are several reasons for this. One reason is that it helps reducing the necessary supply voltage and thus reduces the power consumption of the chip. Another reason is that using balanced circuits obviates the need for a reference potential, and makes the individual circuits less likely to pick up noise transmitted from other circuits on the chip through the semiconducting material.

The invention provides a RF semiconductor chip with an electrostatic discharge protection means, without the above drawbacks.

SUMMARY OF THE INVENTION

A chip assembly according to the invention, comprises a discharge means connected to an RF common mode node, which is preferably on the support.

Preferably the discharge means is located within the chip, so that it can be provided during chip manufacture.

The discharge means is preferably a diode or a zener-diode or a combination thereof, depending on the polarity of the charge to be sinked, and whether the charge should be sinked to DC ground or to supply voltage.

DETAILED DESCRIPTION OF THE INVENTION

Figure 1:
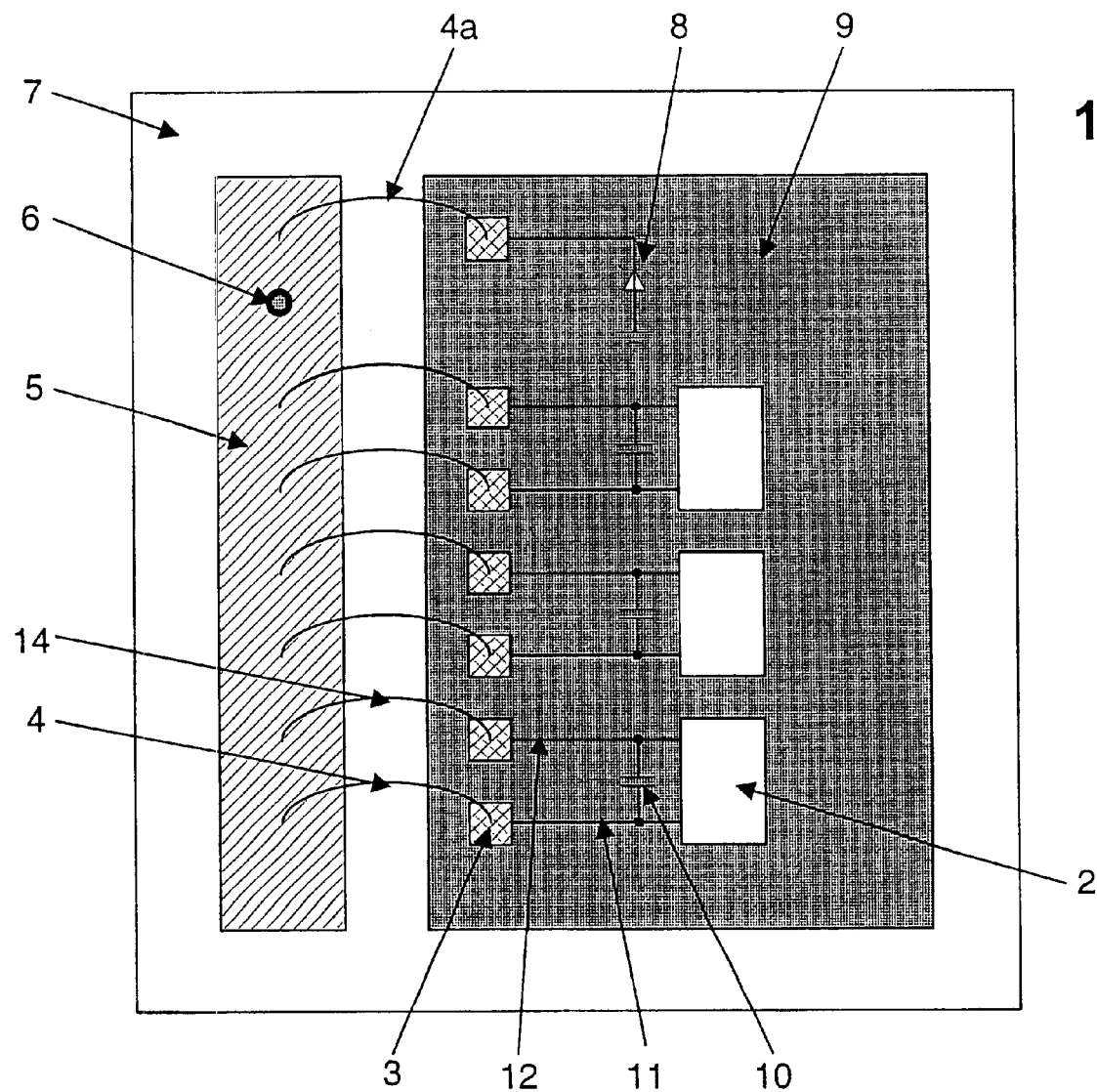
In FIG. 1 there is shown a chip assembly 1 according to the invention.

The invention will now be explained in greater detail using a non-limiting example, and with reference to FIG.1, which schematically shows a chip assembly according to the invention.

The chip assembly comprises a support 7 on which a chip 9 in mounted by means of gluing or similar mounting method.

The chip comprises a number of different circuits. In the present example three of these circuits are embodied as balanced voltage controlled oscillators or VCO's 2. Each of the VCO's 2 comprise a pair of balanced on-chip leads 11 and 12 leading to respective connection pads 3 on the chip 9.

Between the leads 11 and 12 of each pair of leads there is provided a capacitance 10.

The connection pads 3 on the chip are connected to a metal covered area 5 on the support 7, by means of bondwires 4.

The leads 11 and 12 and the bondwires 4 and 14, together with the capacitance 10, form the essential parts of LC circuit determining the operating frequency for the respective VCO 2 to which they are connected.

Because the VCO-circuits 2 are balanced, the metal covered area 5 constitutes a common mode node for each of the individual VCO-circuits 2, to which node the circuit is connected via the bondwires 4 and 14, and the on-chip leads 11 and 12. i.e. the metal covered area 5 constitutes a node with an undefined but essentially fixed potential around which the RF signals are balanced during operation of the chip 9. The operation of the individual balanced circuits 2 are largely independent of this potential.

This allows several circuits such as VCO's 2 to be connected to the same metal covered area 5 essentially without influencing each other i.e. they may operate independently, e.g. at different frequencies.

Further, this allows current supply for the VCO's via a pin 6 connecting the metal covered area 5 to the exterior of the chip assembly 1.

If charge accumulates on or is transferred to this pin 6 during manufacture, handling, storing, transport or mounting etc. of the chip there is, as described above, the potential risk of a destructive discharge within the chip, e.g. in the transistors thereof.

To overcome this risk the chip has been provided with a discharge means 8, in this exemplary embodiment in the form of a zener diode 8. The zener diode 8 is at one end connected to DC ground, and at the other to the metal covered area 5, by means of a bondwire 4a. The polarity and the zener voltage of the diode 8 are chosen so that during normal operation the zener diode 8 blocks the DC supply voltage i.e. prevents it form short circuiting to the DC ground.

If charge accumulates on, or is transferred to, the pin 6 or the metal covered area 5, the potential on the metal covered area 5 will exceed the zener voltage of the zener diode 8, and thus be short circuited to DC ground without harming circuits 2 on the chip.

Because the zener diode 8 is connected to the metal covered area 5, which during operation of the chip constitutes an RF common mode node, i.e. a node with an undefined but essentially constant potential around which the RF signals are balanced, the presence of the zener diode 8 and the inevitable inductance of the bondwire 4a does not have much influence on the operation of the VCO's 2. Rather, since the metal covered area 5 has an essentially constant DC potential, the capacitances and inductances of the diode 8 and the bondwire have no significant effect on the operation of the VCO.

Providing the discharge means 8 between the common mode node, in the form of the metal covered area 5, not only provides a DC path for the accumulated charge to ground, which does not load the circuits 2, but further allows several basically independent balanced circuits 2 on the chip 9 to share the same discharge means.

In the present embodiment the common mode node is in the form of a metallic area 5 outside the chip 9, whereas both the circuits 2 and the discharge means 8 are on the chip 9.

This is however not a prerequisite for the invention.

In principle the zener diode 8 could be a separate component placed on the support 7, but for manufacturing reasons it is desirable to provide this component on the chip 9, thus allowing it to be manufactured cheaply together with the other circuits 2, and further not necessitating separate mounting thereof in the chip assembly 1.

Conversely, the common mode node could be provided within the chip 9 instead of being connected thereto via the sets of bondwires 11 and 12, and the bondwire 4a to the discharge means 8.

In connection with VCO's 2, the present embodiment is however preferred, because the bondwires 11 and 12 are used to provide tuning inductances for the VCO's 2.

Regardless of the fact that the above explanation of the present invention has been based on an embodiment with VCO's, a skilled person appreciates that the invention may be used for various other balanced circuits on a chip without deviating from the inventive concept.

What is claimed is:

1. A chip assembly comprising a chip mounted on a support, the chip assembly comprising at least one terminal and discharge means for discharging a charge accumulated on or transferred to the at least one terminal, wherein the discharge means is connected to a common mode node of at least one balanced circuit on the chip.

2. A chip assembly according to claim 1, wherein the common mode node is located on the support.

3. A chip assembly according to claim 1, wherein the discharge means is located on the chip.

4. A chip assembly according to claim 2, wherein the discharge means is located on the chip.

5. A chip assembly according to claim 1, wherein the discharge means comprises a diode.

6. A chip assembly according to claim 2, wherein the discharge means comprises a diode.

7. A chip assembly according to claim 3, wherein the discharge means comprises a diode.

8. A chip assembly according to claim 4, wherein the discharge means comprises a diode.

9. A chip assembly according to claim 5, wherein the diode comprises a Zener diode.

10. A chip assembly according to claim 6, wherein the diode comprises a Zener diode.

11. A chip assembly according to claim 7, wherein the diode comprises a Zener diode.

12. A chip assembly according to claim 8, wherein the diode comprises a Zener diode.

13. A chip assembly according to claim 1, wherein the common mode node is a RF common mode node for more than one circuit on the chip.

14. A chip assembly according to claim 2, wherein the common mode node is a RF common mode node for more than one circuit on the chip.

15. A chip assembly according to claim 3, wherein the common mode node is a RF common mode node for more than one circuit on the chip.

16. A chip assembly according to claim 4, wherein the common mode node is a RF common mode node for more than one circuit on the chip.

17. A chip assembly according to claim 5, wherein the common mode node is a RF common mode node for more than one circuit on the chip.

18. A chip assembly according to claim 6, wherein the common mode node is a RF common mode node for more than one circuit on the chip.

19. A chip assembly according to claim 7, wherein the common mode node is a RF common mode node for more than one circuit on the chip.

20. A chip assembly according to claim 8, wherein the common mode node is a RF common mode node for more than one circuit on the chip.

21. A chip assembly according to claim 9, wherein the common mode node is a RF common mode node for more than one circuit on the chip.

22. A chip assembly according to claim 10, wherein the common mode node is a RF common mode node for more than one circuit on the chip.

23. A chip assembly according to claim 11, wherein the common mode node is a RF common mode node for more than one circuit on the chip.

24. A chip assembly according to claim 12, wherein the common mode node is a RF common mode node for more than one circuit on the chip.

25. A chip assembly according to claim 1, wherein the chip comprises a voltage controlled oscillator.

26. A chip assembly according to claim 2, wherein the chip comprises a voltage controlled oscillator.

27. A chip assembly according to claim 3, wherein the chip comprises a voltage controlled oscillator.

28. A chip assembly according to claim 5, wherein the chip comprises a voltage controlled oscillator.

29. A chip assembly according to claim 9, wherein the chip comprises a voltage controlled oscillator.

30. A chip assembly according to claim 13, wherein the chip comprises a voltage controlled oscillator.

31. A method for protecting at least one balanced circuit on a chip against electrostatic discharge, wherein an electrostatic discharge means is provided between a common mode node of the at least one balanced circuit and at least one of a ground and voltage supply.

* * * * *